United States Patent
Kita

(10) Patent No.: US 8,587,764 B2
(45) Date of Patent: Nov. 19, 2013

(54) OPTICAL INTEGRATOR SYSTEM, ILLUMINATION OPTICAL APPARATUS, EXPOSURE APPARATUS, AND DEVICE MANUFACTURING METHOD

(75) Inventor: Naonori Kita, Ageo (JP)

(73) Assignee: Nikon Corporation, Tokyo (JP)

( * ) Notice: Subject to any disclaimer, the term of this patent is extended or adjusted under 35 U.S.C. 154(b) by 1227 days.

(21) Appl. No.: 12/068,818

(22) Filed: Feb. 12, 2008

(65) Prior Publication Data

US 2008/0225256 A1 Sep. 18, 2008

Related U.S. Application Data

(60) Provisional application No. 60/906,520, filed on Mar. 13, 2007.

(51) Int. Cl.
| | | |
|---|---|---|
| *G03B 27/54* | (2006.01) | |
| *G03B 27/72* | (2006.01) | |
| *G03B 27/42* | (2006.01) | |
| *G03B 27/52* | (2006.01) | |

(52) U.S. Cl.
USPC .................... 355/67; 355/53; 355/55; 355/71

(58) Field of Classification Search
USPC ............ 355/52, 53, 55, 67–71; 359/619, 621, 359/622, 623, 624, 626; 430/5, 8, 22, 30, 430/311, 312, 321; 250/492.1, 492.2, 250/492.22, 548
See application file for complete search history.

(56) References Cited

U.S. PATENT DOCUMENTS

| | | | | |
|---|---|---|---|---|
| 4,305,643 A | | 12/1981 | Tosswill | |
| 4,988,188 A | * | 1/1991 | Ohta | 353/122 |
| 5,459,547 A | * | 10/1995 | Shiozawa | 355/67 |
| 5,534,970 A | * | 7/1996 | Nakashima et al. | 355/53 |
| 5,726,739 A | * | 3/1998 | Hayata | 355/67 |
| 5,739,899 A | * | 4/1998 | Nishi et al. | 355/53 |
| 5,760,963 A | * | 6/1998 | Mori | 359/622 |
| 6,040,894 A | * | 3/2000 | Takahashi | 355/53 |
| 6,185,018 B1 | * | 2/2001 | Kihara | 359/23 |
| 6,433,934 B1 | | 8/2002 | Reznichenko et al. | |
| 6,497,488 B1 | | 12/2002 | Yamauchi et al. | |

(Continued)

FOREIGN PATENT DOCUMENTS

| | | |
|---|---|---|
| EP | 1 837 895 A1 | 9/2007 |
| GB | 2 438 963 A | 12/2007 |

(Continued)

OTHER PUBLICATIONS

English translation of JP 2004-198748, published Jul. 15, 2004.*

*Primary Examiner* — Toan Ton
*Assistant Examiner* — Christina Riddle
(74) *Attorney, Agent, or Firm* — Oliff & Berridge, PLC

(57) ABSTRACT

An optical integrator system comprises a first optical integrator including a plurality of first wavefront dividing elements two-dimensionally juxtaposed, and a second optical integrator including a plurality of second wavefront dividing elements two-dimensionally juxtaposed. Each of the first wavefront dividing elements is so constructed that rays obliquely incident to a center on an optical axis of an entrance surface are emitted in parallel with the optical axis. Each of the second wavefront dividing elements is also so constructed that rays obliquely incident to a center on an optical axis of an entrance surface are emitted in parallel with the optical axis. The system satisfies the condition of $P2/(2\times \tan \theta) < L12$.

20 Claims, 14 Drawing Sheets

(56) References Cited

U.S. PATENT DOCUMENTS

| | | |
|---|---|---|
| 6,583,937 B1 | 6/2003 | Wangler et al. |
| 6,587,182 B1 | 7/2003 | Goto |
| 6,741,394 B1 * | 5/2004 | Tanitsu et al. ............... 359/619 |
| 7,027,228 B2 | 4/2006 | Mikhailov |
| 2003/0025890 A1 * | 2/2003 | Nishinaga .................. 355/53 |
| 2003/0038931 A1 * | 2/2003 | Toyoda et al. ............... 355/67 |
| 2003/0156266 A1 * | 8/2003 | Tanitsu ....................... 355/67 |
| 2003/0164933 A1 * | 9/2003 | Nishi et al. .................. 355/67 |
| 2004/0036977 A1 * | 2/2004 | Tanaka et al. ............... 359/619 |
| 2006/0109443 A1 | 5/2006 | Toyoda |
| 2006/0222041 A1 | 10/2006 | Moriwaka |
| 2007/0053066 A1 | 3/2007 | Mitra |
| 2007/0127132 A1 | 6/2007 | Lissotschenko et al. |
| 2007/0268794 A1 | 11/2007 | Hill |
| 2008/0002261 A1 | 1/2008 | Hill et al. |
| 2008/0074631 A1 | 3/2008 | Kita |
| 2009/0021839 A1 * | 1/2009 | Wolf et al. .................... 359/621 |

FOREIGN PATENT DOCUMENTS

| | | | |
|---|---|---|---|
| JP | 07174974 A | * | 7/1995 |
| JP | A-2002-0158157 | | 5/2002 |
| JP | 2004198748 A | * | 7/2004 |
| JP | A-2004-0198748 | | 7/2004 |
| JP | A-2005-79470 | | 3/2005 |
| WO | WO 2006/070580 A1 | | 7/2006 |

* cited by examiner

OPTICAL INTEGRATOR SYSTEM, ILLUMINATION OPTICAL APPARATUS, EXPOSURE APPARATUS, AND DEVICE MANUFACTURING METHOD

CROSS-REFERENCE TO RELATED APPLICATIONS

This application is based upon and claims the benefit of priorities from U.S. Provisional Application No. 60/906,520, filed on Mar. 13, 2007, the entire contents of which are incorporated herein by reference.

BACKGROUND

1. Field

An embodiment of the present invention relates to an optical integrator system, an illumination optical apparatus, an exposure apparatus, and a device manufacturing method. More particularly, an embodiment of the present invention relates to an optical integrator system applicable to illumination optical apparatus in exposure apparatus for manufacturing devices (electronic devices and others) such as semiconductor devices, imaging devices, liquid-crystal display devices, and thin-film magnetic heads by lithography.

2. Description of the Related Art

In an exposure apparatus, a beam emitted from a light source is incident to a fly's eye lens as an optical integrator to form a secondary light source consisting of a large number of light sources on the rear focal plane of the fly's eye lens. Beams from the secondary light source travel through an aperture stop and a condenser lens to illuminate a mask with a predetermined pattern in a superimposed manner. Light having passed through the pattern of the mask travels through a projection optical system to be focused on a wafer. In this manner the mask pattern is projected (or transferred) onto the wafer to effect projection exposure thereof.

For example, a cylindrical micro fly's eye lens comprising a pair of fly's eye members having cylindrical lens groups formed on their two side faces is disclosed as an optical integrator capable of keeping down influence on the illuminance distribution from manufacturing errors in the large number of microscopic refracting surfaces integrally formed by etching in Japanese Patent Application Laid-open No. 2004-198748.

SUMMARY

An embodiment of the present invention provides an optical integrator system capable of forming a desired illuminance distribution on a surface to be illuminated, without substantially being affected by the surface shape errors of the optical surfaces of the wavefront dividing elements, for example, even when there is a movable optical member on the upstream side.

Another embodiment of the present invention provides an illumination optical apparatus capable of illuminating a surface to be illuminated under a desired illumination condition, using the optical integrator system for forming the desired illuminance distribution on the surface to be illuminated, without substantially being affected by the surface shape errors of the optical surfaces of the wavefront dividing elements.

Still another embodiments of the present invention provide an exposure apparatus and a device manufacturing method capable of performing good exposure under a good illumination condition, using the illumination optical apparatus for illuminating the surface to be illuminated under the desired illumination condition.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A first embodiment of the present invention provides an optical integrator system comprising a first optical integrator having a plurality of first wavefront dividing elements two-dimensionally juxtaposed, and a second optical integrator having a plurality of second wavefront dividing elements two-dimensionally juxtaposed, the first optical integrator and the second optical integrator being arranged in order from an entrance side of light;

wherein each of the first wavefront dividing elements is so constructed that rays obliquely incident to a center on an optical axis of an entrance surface of the first wavefront dividing element are emitted in parallel with the optical axis from the first wavefront dividing element;

wherein each of the second wavefront dividing elements is so constructed that rays obliquely incident to a center on an optical axis of an entrance surface of the second wavefront dividing element are emitted in parallel with the optical axis from the second wavefront dividing element; and wherein a spacing L12 between an exit surface of the first optical integrator and an entrance surface of the second optical integrator satisfies the condition of $P2/(2 \times \tan \theta) < L12$, where P2 is a pitch along a predetermined direction of the second wavefront dividing elements, and $\theta$ a maximum exit angle (half angle) along the predetermined direction of light from the first wavefront dividing elements.

A second embodiment of the present invention provides an optical integrator system comprising an optical member having a plurality of optical elements two-dimensionally juxtaposed and forming a uniform exit angle, and an optical integrator having a plurality of wavefront dividing elements two-dimensionally juxtaposed, the optical member and the optical integrator being arranged in order from an entrance side of light;

wherein each of the optical elements is so constructed that rays obliquely incident to a center on an optical axis of an entrance surface of the optical element are emitted in parallel with the optical axis from the optical element;

wherein each of the wavefront dividing elements is so constructed that rays obliquely incident to a center on an optical axis of an entrance surface of the wavefront dividing element are emitted in parallel with the optical axis from the wavefront dividing element; and wherein one optical element of the optical member illuminates a region larger than an entrance surface of one wavefront dividing element forming the optical integrator and illuminates a region smaller than an entrance surface of the optical integrator.

A third embodiment of the present invention provides an illumination optical apparatus for illuminating a surface to be illuminated by light from a light source, the illumination optical apparatus comprising the optical integrator system of the first embodiment or the second embodiment arranged in an optical path between the light source and the surface to be illuminated.

A fourth embodiment of the present invention provides an exposure apparatus comprising the illumination optical apparatus of the third embodiment for illuminating a predetermined pattern, whereby a photosensitive substrate is exposed with the predetermined pattern.

A fifth embodiment of the present invention provides a device manufacturing method comprising: exposing the photosensitive substrate with the predetermined pattern, using the exposure apparatus as set forth in claim 11; and developing the exposed photosensitive substrate.

The optical integrator system according to the first embodiment of the present invention comprises an auxiliary fly's eye element as the first optical integrator having the plurality of wavefront dividing elements two-dimensionally juxtaposed, and a main fly's eye element as the second optical integrator having the plurality of wavefront dividing elements two-dimensionally juxtaposed, which are arranged in order from the entrance side of light. Therefore, even when the angles and angular range of light incident to the auxiliary fly's eye element vary, for example, due to the movement of the movable optical member located upstream of the optical integrator system, the angles and angular range of light incident to each wavefront dividing element of the main fly's eye element can be kept constant by the action of the auxiliary fly's eye element and, in turn, a substantially uniform illuminance distribution can be maintained on the surface to be illuminated.

Namely, the optical integrator system according to an embodiment of the present invention is able to form a desired illuminance distribution on the surface to be illuminated, without substantially being affected by the surface shape errors of the optical surfaces of the wavefront dividing elements, for example, even when there is the movable optical member on the upstream side. Therefore, the illumination optical apparatus according to an embodiment of the present invention is able to illuminate the surface to be illuminated under a desired illumination condition, using the optical integrator system for forming the desired illuminance distribution on the surface to be illuminated, without substantially being affected by the surface shape errors of the optical surfaces of the wavefront dividing elements. The exposure apparatus according to an embodiment of the present invention is able to perform good exposure under a good illumination condition, using the illumination optical apparatus for illuminating the surface to be illuminated under the desired illumination condition and to manufacture good devices eventually.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION

Figure 1:
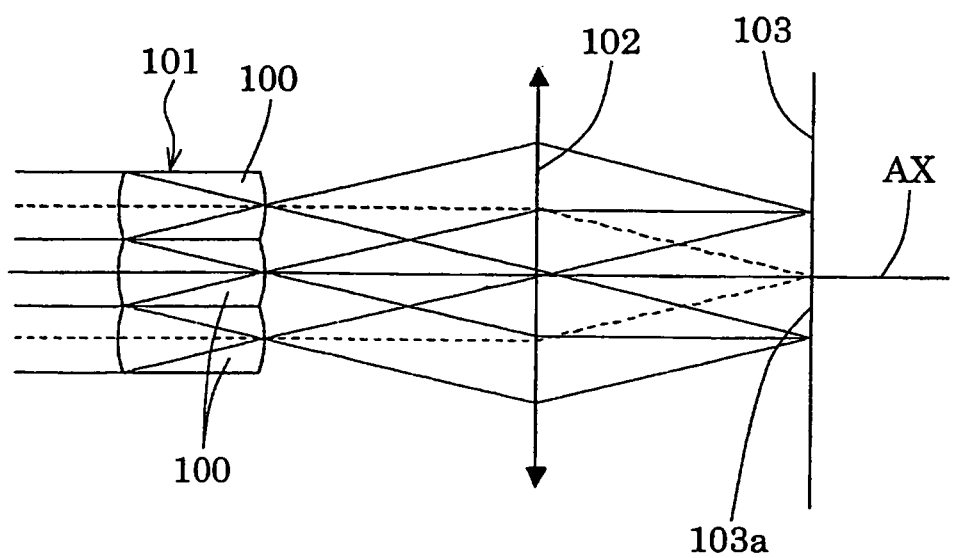
FIG. 1 is a drawing schematically showing a configuration of a fly's eye element composed of a plurality of biconvex lens elements arrayed vertically and horizontally and densely.

The function of a fly's eye element (which is a broad concept including a fly's eye lens, a micro fly's eye lens, a cylindrical micro fly's eye lens, and the like), and the fundamental configuration and action of an embodiment of the present invention will be described prior to specific description of embodiments of the present invention. For simplifying the description, the below will describe an example using a fly's eye lens 101 composed of a plurality of biconvex lens elements (wavefront dividing elements) 100 arrayed vertically and horizontally and densely (two-dimensionally juxtaposed) as shown in FIG. 1, as the fly's eye element.

Figure 2:
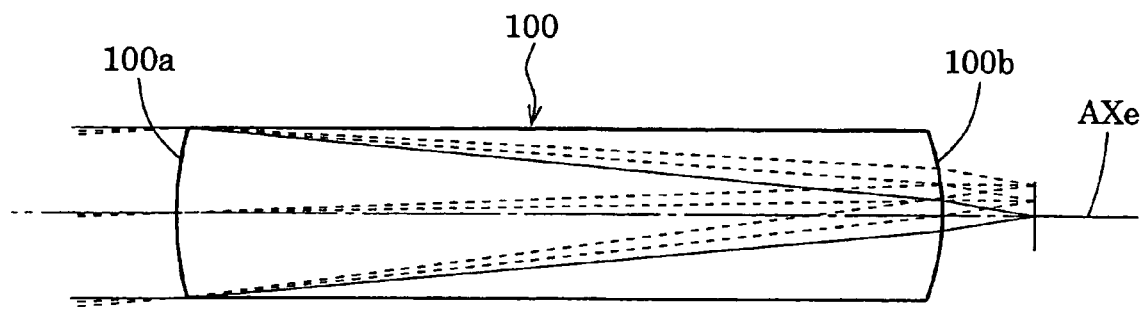
FIG. 2 is a drawing to illustrate a state in which a fly's eye element ensures the same exit NA for obliquely incident parallel light as that for normally incident parallel light.

The fly's eye element 101 arranged along the optical axis AX of an illumination optical apparatus acts to uniform an illuminance distribution in an illumination field 103a, while ensuring the required illumination field 103a on a surface to be illuminated 103. For this purpose, a beam incident to an entrance surface 100a of each lens element 100 forms a point light source near an exit surface 100b and beams from the respective point light sources travel through a condenser optical system 102 to illuminate the illumination region 103a on the surface to be illuminated 103 in a superimposed manner. At this time, as shown in FIG. 2, parallel light (indicated by solid lines in FIG. 2) normally incident (or incident in the direction of the optical axis AXe of the lens element 100) to the entrance surface 100a of the lens element 100 is emitted as light with a predetermined exit NA from the exit surface 100b and eventually turns into light with a required NA (numerical aperture or angular range) to reach the illumination region 103a.

Figure 3:
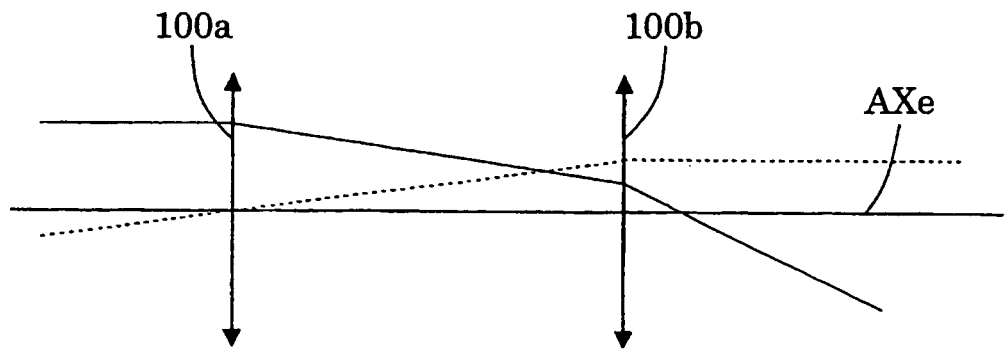
FIG. 3 is a drawing to illustrate a condition for ensuring the same exit NA for obliquely incident parallel light and normally incident parallel light in a fly's eye element.

Furthermore, in the fly's eye element 101, parallel light (indicated by dashed lines in FIG. 2) obliquely incident (or incident in oblique directions to the optical axis AXe) to the entrance surface 100a of the lens element 100 is also emitted as light with the same exit NA as that of the normally incident parallel light and with its center angle (principal ray angle in each lens element) parallel to the optical axis from the exit surface 100b and eventually turns into light with the same NA as that of the normally incident parallel light and with its center angle parallel to the optical axis to reach the illumination region 103a. The condition for ensuring the same central angle for the obliquely incident parallel light as that for the normally incident parallel light is realized by satisfying the condition that a principal ray (indicated by a dashed line in FIG. 3) passing through the center on the optical axis (an intersecting point between the entrance surface 100a and the optical axis AXe) on the entrance surface 100a is emitted as light parallel to the optical axis AXe from the exit surface 100b, as shown in FIG. 3. In passing, this condition results in keeping the entrance surface 100a conjugate with the surface to be illuminated.

As described above, the fly's eye element 101 is so constructed that rays obliquely incident to the center on the optical axis of the entrance surface 100a of each lens element 100 being a wavefront dividing element are emitted in parallel with the optical axis AXe from the exit surface 100b. The fly's eye element 101 is so constructed that a maximum exit angle (half angle; angle corresponding to the exit NA) of light from the exit surface 100b made by light (parallel light or the like) incident along the direction of the optical axis AXe to the entrance surface 100a of each lens element 100 becomes equal to a maximum exit angle (half angle; angle corresponding to the exit NA) of light from the exit surface 100b made by light (parallel light or the like) incident along oblique directions to the optical axis AXe to the entrance surface 100a. Therefore, parallel light beams incident at various angles to the fly's eye element 101 are emitted as parallel light beams each with the same NA and with its center angle parallel to the optical axis, and thus have exit angle characteristics completely independent of the angular range (NA) and the central angle of incident light to the fly's eye element 101.

In passing, for example, a microlens array except for the fly's eye element is so constructed that rays obliquely incident to the center on the optical axis of the entrance surface of each wavefront dividing element are not emitted in parallel with the optical axis but are emitted obliquely from the wavefront dividing element. As a result, parallel light beams incident at various angles to the microlens array of this type are emitted each with the same NA (angular range) but with their central angle (principal ray angle) being kept as it is, and thus eventually have exit angle characteristics dependent on the angular range (NA) and its central angle of incident light to the microlens array, different from the fly's eye element 101.

As described previously, the region where light passes through the exit surface 100b of the lens element 100 also varies with change in the angle of light incident to the lens element 100 (an angle made to the optical axis AXe of the lens element 100 by a centroid ray or central ray of an incident beam) and the angular range (maximum angle made by rays incident to a point on the entrance surface 100a), for example, due to movement of the movable optical member located upstream of the fly's eye element 101. When there is a surface shape error in the exit surface 100b of the lens element 100, a change in the region where light passes through the exit surface 100b will result in a change in the illuminance distribution formed in the illumination region 103a on the surface to be illuminated 103, so as to cause illumination unevenness eventually.

The embodiment of the present invention is based on recognition of the problem as described above and proposes a configuration wherein an auxiliary fly's eye element is additionally provided upstream of a main fly's eye element, while noting the function of the fly's eye element, i.e., the function to always emit light with a constant NA and guide the light to a downstream optical member even with variation in the angles and angular range of light incident to the wavefront dividing elements of the fly's eye element. In the configuration of the embodiment of the present invention, the additional provision of the auxiliary fly's eye element stabilizes the angles and the angular range of light incident to each wavefront dividing element of the main fly's eye element and light always passes through the same region on the exit surface of each wavefront dividing element of the main fly's eye element, so as to stabilize the illuminance distribution on the surface to be illuminated as a consequence.

Namely, the optical integrator system of the embodiment of the present invention is comprised of the auxiliary fly's eye element (first optical integrator) having a plurality of wavefront dividing elements two-dimensionally juxtaposed, and the main fly's eye element (second optical integrator) having a plurality of wavefront dividing elements two-dimensionally juxtaposed, which are arranged in order from the entrance side of light. Therefore, even when the angles and angular range of light incident to the auxiliary fly's eye element vary, for example, due to movement of the movable optical member disposed upstream of the optical integrator system, the angles and angular range of light incident to each wavefront dividing element of the main fly's eye element can be kept constant by the action of the auxiliary fly's eye element and, in turn, the uniform illuminance distribution can be maintained on the surface to be illuminated.

When the auxiliary fly's eye element (first optical integrator) located on the entrance side of light in the optical integrator system of the embodiment of the present invention is seen from another point of view, it can also be regarded as an optical member for forming a uniform exit angle, which does not function as a fly's eye element (first optical integrator) but which functions to convert light incident into each optical element, into light with a constant NA (numerical aperture or angular range) and to emit rays obliquely incident to the center on the optical axis of the entrance surface of each optical element, in parallel with the optical axis. In this case, an optical member such as a lens with no power or with a weak power may be interposed between the optical member composed of a large number of optical elements and forming the uniform exit angle, and the fly's eye element (optical integrator), and the system can be so constructed that one optical element of the optical member forming the uniform exit angle illuminates a region larger than an entrance surface of one optical element of the fly's eye element (optical integrator) and illuminates a region smaller than the entrance surface of the fly's eye element (optical integrator).

Figure 4A:
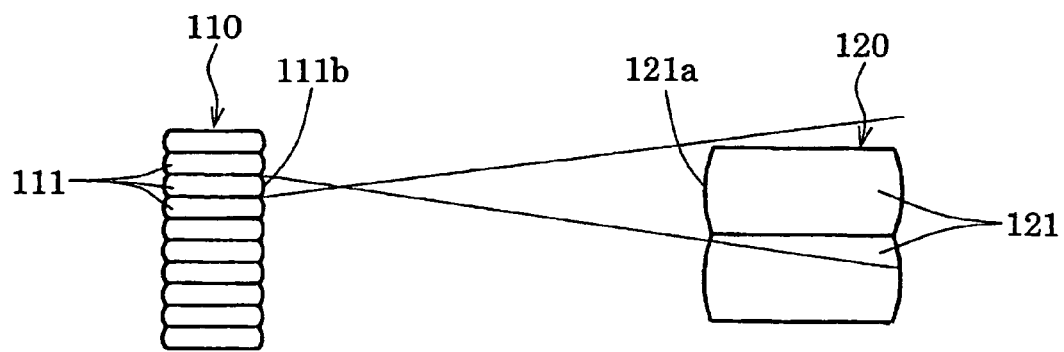
FIG. 4A is a drawing to illustrate that light from one wavefront dividing exit surface of an auxiliary fly's eye element illuminates at least the whole of one wavefront dividing entrance surface of a main fly's eye element.
Figure 4B:
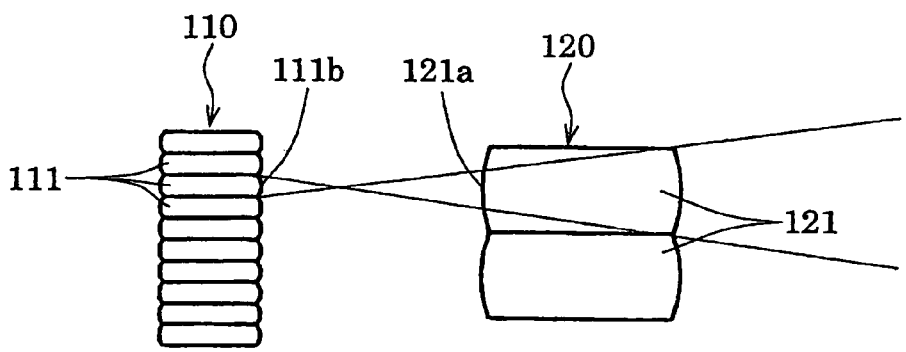
FIG. 4B is a drawing to illustrate that light from one wavefront dividing exit surface of an auxiliary fly's eye element illuminates only a portion of one wavefront dividing entrance surface of a main fly's eye element.

It is, however, noted that, for fully exercising the action of the auxiliary fly's eye element in the embodiment of the present invention to achieve the effect of the embodiment of the present invention well, light emitted from an exit surface 111b of one wavefront dividing element 111 of the auxiliary fly's eye element 110 can illuminate at least the whole of an entrance surface 121a of one wavefront dividing element 121 of the main fly's eye element 120, as shown in FIG. 4A. In a configuration wherein only a portion of one entrance surface 121a of the main fly's eye element 120 is illuminated with the light from one exit surface 111b of the auxiliary fly's eye element 110, as shown in FIG. 4B, the angles and angular range of incident light are not constant across the entire entrance surface 121a and a uniform illuminance distribution cannot be maintained on the surface to be illuminated.

Figure 5:
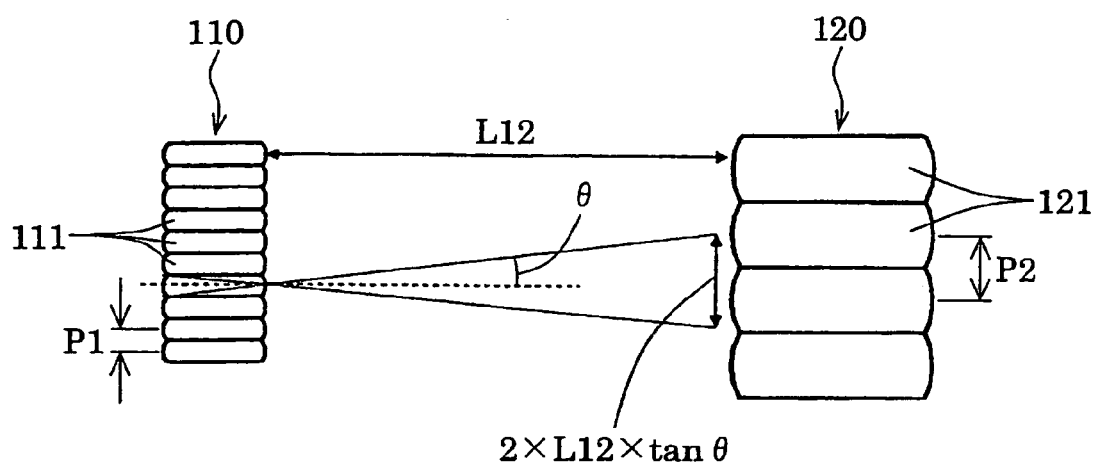
FIG. 5 is a drawing to illustrate a minimum spacing between the auxiliary fly's eye element and the main fly's eye element.

In other words, in the optical integrator system of the embodiment of the present invention, a spacing L12 between the exit surface of the auxiliary fly's eye element (first optical integrator) 110 and the entrance surface of the main fly's eye element (second optical integrator) 120 can satisfy the following Condition (1), as shown in FIG. 5. In Condition (1), P2 is the pitch of the wavefront dividing elements 121 of the main fly's eye element 120 and θ the maximum exit angle (half angle) of light from the wavefront dividing element 111 of the auxiliary fly's eye element 110.

$$P2/(2\times\tan\theta)<L12 \tag{1}$$

Figure 6:
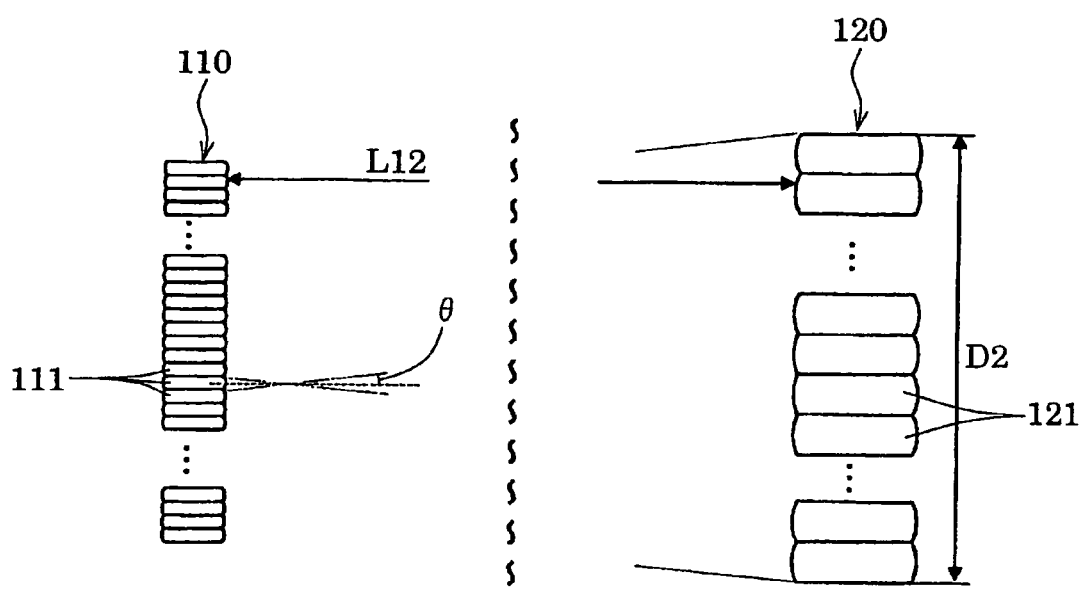
FIG. 6 is a drawing to illustrate a maximum spacing between the auxiliary fly's eye element and the main fly's eye element.

Condition (1) demands that the spacing L12 between the exit surface of the auxiliary fly's eye element 110 and the entrance surface of the main fly's eye element 120 should be set larger than a predetermined value. However, to set the spacing L12 too large may cause a loss in light quantity because portion of light from one exit surface 111 of the auxiliary fly's eye element 110 becomes not incident to the main fly's eye element 120 (or does not contribute to illumination). Namely, from the viewpoint of avoiding the loss in light quantity, in the optical integrator system of the embodiment of the present invention, the spacing L12 can satisfy the following Condition (2) as shown in FIG. 6. In Condition (2), D2 is a length of the entrance surface of the main fly's eye element 120.

$$L12<D2/(2\times\tan\theta) \tag{2}$$

Also, in the optical integrator system of the embodiment of the present invention, while the pitch P1 (cf. FIG. 5) of the wavefront dividing elements 111 of the auxiliary fly's eye element 110 is set as small as possible, the pitch P2 of the wavefront dividing elements 121 of the main fly's eye element 120 can be set so as to be substantially different from an integral multiple of the pitch P1. When the pitch P2 of the wavefront dividing elements 121 of the main fly's eye element 120 is set to an integral multiple of the pitch P1 of the wavefront dividing elements 111 of the auxiliary fly's eye element 110, periodical overlap structures will become likely to appear in the illuminance distribution of light incident to one wavefront dividing element 121 of the main fly's eye element 120, so that a uniform illuminance distribution cannot be obtained on the surface to be illuminated.

In the optical integrator system of the embodiment of the present invention there is no need for highly accurately positioning the auxiliary fly's eye element (first optical integrator) 110 and the main fly's eye element (second optical integrator) 120, for example, in the direction perpendicular to the optical axis of the illumination optical apparatus (the vertical direction in FIGS. 5 and 6). In the embodiment of the present invention, the light emitted from the exit surface 111b of one wavefront dividing element 111 of the auxiliary fly's eye element 110 can illuminate at least the entire entrance surface 121a of one wavefront dividing element 121 of the main fly's eye element 120, thereby to keep constant the angles and angular range of light incident to the entrance surface 121a. In the optical integrator system of the embodiment of the present invention, a space between the first optical integrator and the second optical integrator can be filled with a gas. In the optical integrator system of the embodiment of the present invention, no lens or no optical element having optical power can be arranged in the space between the first and second optical integrator.

Figure 7:
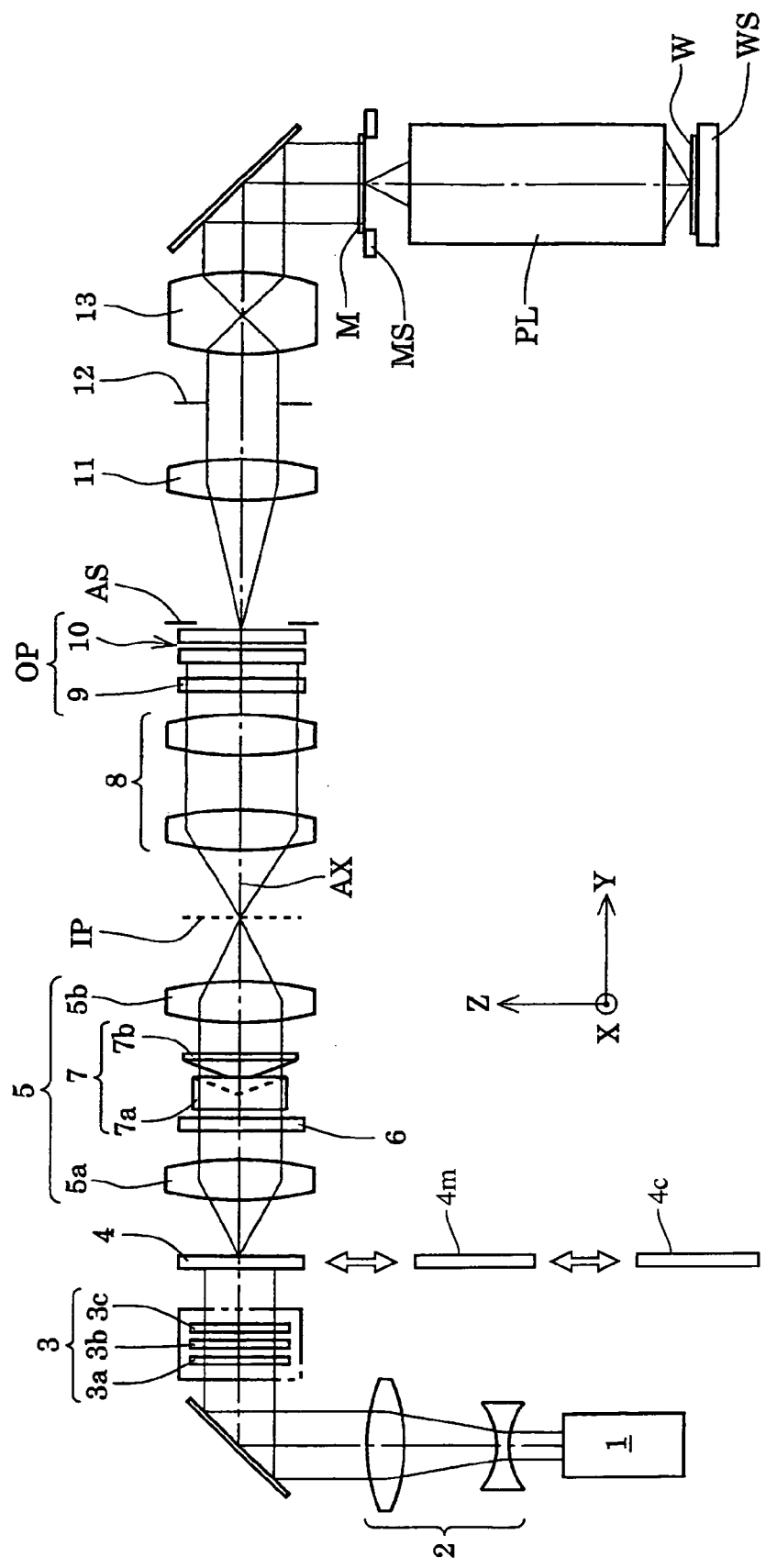
FIG. 7 is a drawing schematically showing a configuration of an exposure apparatus according to an embodiment of the present invention.

Embodiments of the present invention will be described on the basis of the accompanying drawings. FIG. 7 is a drawing schematically showing a configuration of an exposure apparatus according to an embodiment of the present invention. In FIG. 7, the Z-axis is defined along a direction of a normal to a wafer W being a photosensitive substrate, the Y-axis along a direction parallel to the page of FIG. 7 in the surface of the wafer W, and the X-axis along a direction normal to the page of FIG. 7 in the surface of the wafer W. With reference to FIG. 7, the exposure apparatus of the present embodiment is provided with a light source 1 for supplying exposure light (illumination light). The light source 1 can be, for example, an ArF excimer laser light source for supplying light at the wavelength of 193 nm, a KrF excimer laser light source for supplying light at the wavelength of 248 nm, or the like.

The light emitted from the light source 1 is expanded into a beam of a required sectional shape by a shaping optical system 2 and the expanded beam travels through a polarization state switch 3 and a diffractive optical element 4 for annular illumination to enter an afocal lens 5. The polarization state switch 3 is composed of a quarter wave plate 3a the crystal optical axis of which is arranged to be rotatable about the optical axis AX and which converts elliptically polarized light incident thereto, into linearly polarized light, a half wave plate 3b the crystal optical axis of which is arranged to be rotatable about the optical axis AX and which changes a direction of polarization of incident linearly polarized light, and a depolarizer (depolarizing element) 3c arranged as retractable from the illumination optical path.

In a state in which the depolarizer 3c is retracted from the illumination optical path, the polarization state switch 3 has a function to convert the light from the light source 1 into linearly polarized light having a desired polarization direction and guide the linearly polarized light into the diffractive optical element 4; in a state in which the depolarizer 3c is set in the illumination optical path, the polarization state switch 3 has a function to convert the light from the light source 1 into substantially unpolarized light and guide the unpolarized light into the diffractive optical element 4. The afocal lens 5 is an afocal system (afocal optical system) the front focal position of which agrees substantially with the position of the diffractive optical element 4 and the rear focal position of which agrees substantially with a position of a predetermined plane IP indicated by a dashed line in the drawing.

The diffractive optical element 4 is made by forming level differences at the pitch approximately equal to the wavelength of the exposure light (illumination light) in a substrate, and has the action to diffract an incident beam to desired angles. Specifically, the diffractive optical element 4 for annular illumination has the following function: when a parallel beam with a rectangular cross section is incident thereto, it forms an annular light intensity distribution in its far field (or Fraunhofer diffraction region). Therefore, a nearly parallel beam incident to the diffractive optical element 4 forms an annular light intensity distribution on the pupil plane of the afocal lens 5 and is then emitted in an annular angle distribution from the afocal lens 5.

A polarization converting element 6 and a conical axicon system 7 are arranged in the optical path between a front lens unit 5a and a rear lens unit 5b of the afocal lens 5 and at or near the pupil position thereof. The configurations and actions of the polarization converting element 6 and the conical axicon system 7 will be described later. The beam having passed through the afocal lens 5 travels through a zoom lens 8 for varying the σ value (σ value=mask-side numerical aperture of the illumination optical apparatus/mask-side numerical aperture of the projection optical system), to enter an optical integrator system OP. The optical integrator system OP is composed of an auxiliary fly's eye element 9 as the first optical integrator having a plurality of wavefront dividing elements two-dimensionally juxtaposed, and a cylindrical micro fly's eye lens 10 as the second optical integrator having a plurality of wavefront dividing elements two-dimensionally juxtaposed, in order from the entrance side of light.

Figure 8:
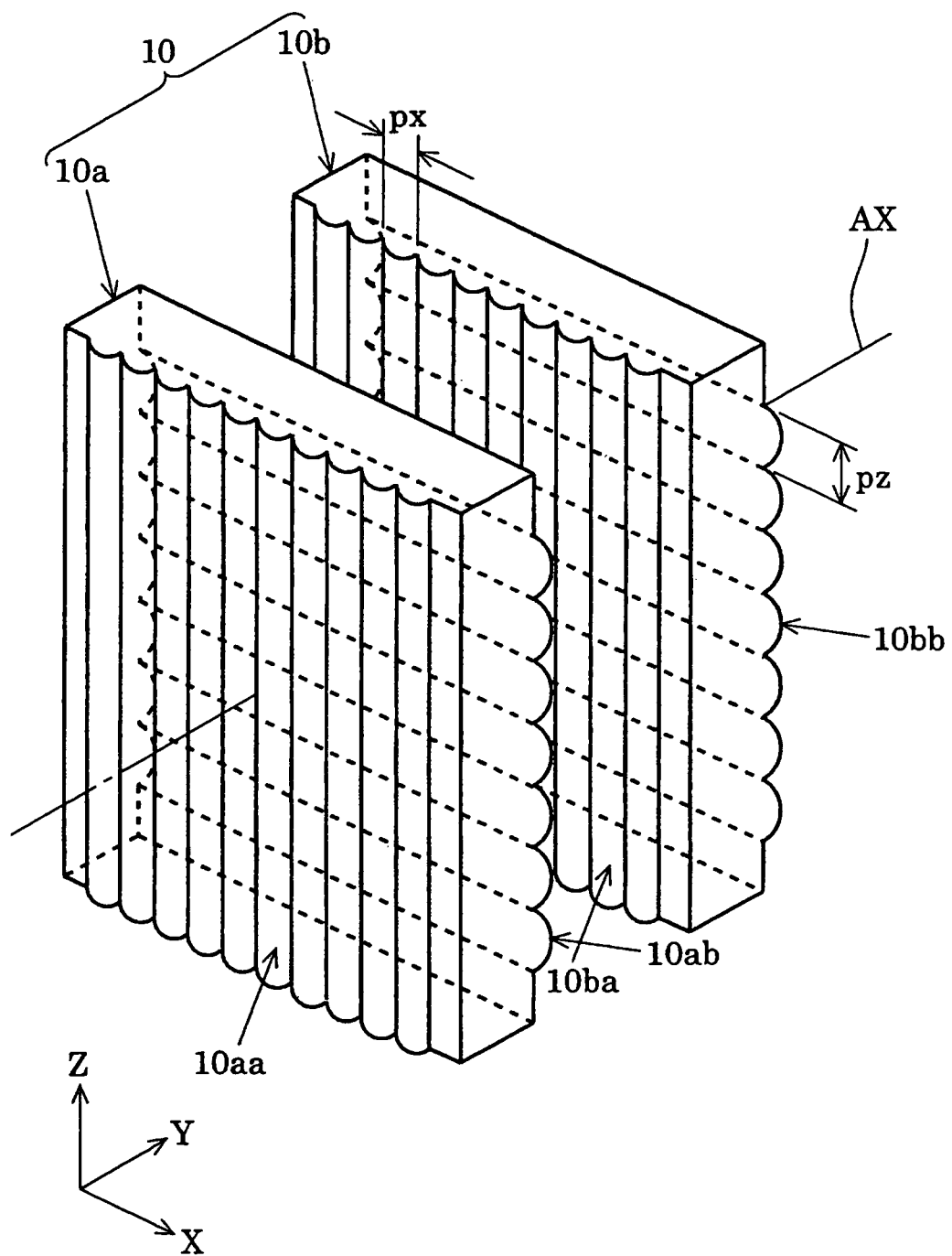
FIG. 8 is a perspective view schematically showing a configuration of a cylindrical micro fly's eye lens shown in FIG. 7.

The auxiliary fly's eye element 9 is a fly's eye lens made, for example, by arraying a plurality of biconvex lens elements vertically and horizontally and densely. The cylindrical micro fly's eye lens 10 is composed of a first fly's eye member 10a located on the light source side and a second fly's eye member 10b located on the mask side, as shown in FIG. 8. Cylindrical lens groups 10aa and 10ba arrayed in juxtaposition in the X-direction are formed each at the pitch px in the light-source-side surface of the first fly's eye member 10a and in the light-source-side surface of the second fly's eye member 10b, respectively.

Cylindrical lens groups 10ab and 10bb arrayed in juxtaposition in the Z-direction are formed each at the pitch pz(pz>px) in the mask-side surface of the first fly's eye member 10a and in the mask-side surface of the second fly's eye member 10b, respectively. When attention is focused on the refracting action in the X-direction (or the refracting action in the XY plane) of the cylindrical micro fly's eye lens 10, a parallel beam incident along the optical axis AX is wavefront-divided at the pitch px along the X-direction by the cylindrical lens group 10aa formed on the light source side of the first fly's eye member 10a, condensed by the refracting surfaces thereof, and thereafter condensed by the refracting surfaces of the corresponding cylindrical lenses in the cylindrical lens group 10ba formed on the light source side of the second fly's eye member 10b, to be converged on the rear focal plane of the cylindrical micro fly's eye lens 10.

When attention is focused on the refracting action in the Z-direction (or the refracting action in the YZ plane) of the cylindrical micro fly's eye lens 10, a parallel beam incident along the optical axis AX is wavefront-divided at the pitch pz along the Z-direction by the cylindrical lens group 10ab formed on the mask side of the first fly's eye member 10a, condensed by the refracting surfaces thereof, and thereafter condensed by the refracting surfaces of the corresponding cylindrical lenses in the cylindrical lens group 10bb formed on the mask side of the second fly's eye member 10b, to be converged on the rear focal plane of the cylindrical micro fly's eye lens 10.

As described above, the cylindrical micro fly's eye lens 10 is composed of the first fly's eye member 10a and the second fly's eye member 10b in each of which the cylindrical lens groups are arranged in the two side faces, and exercises the same optical function as the micro fly's eye lens in which a large number of rectangular microscopic refracting surfaces (wavefront dividing elements) having the size of px in the X-direction and the size of pz in the Z-direction are integrally formed vertically and horizontally and densely. The cylindrical micro fly's eye lens 10 is able to keep down change in distortion due to variation in the surface shape of the microscopic refracting surfaces and, for example, to reduce the influence on the illuminance distribution from manufacturing errors of the large number of microscopic refracting surfaces integrally formed by etching.

The position of the predetermined plane IP is located near the front focal position of the zoom lens 8 and the entrance surface of the cylindrical micro fly's eye lens 10 is located near the rear focal position of the zoom lens 8. In other words, the zoom lens 8 acts to keep the predetermined plane IP and the entrance surface of the cylindrical micro fly's eye lens 10 substantially in the relation of Fourier transform and, in turn, to keep the pupil plane of the afocal lens 5 and the entrance surface of the cylindrical micro fly's eye lens 10 optically substantially conjugate with each other.

Therefore, for example, an annular illumination field centered on the optical axis AX is formed on the entrance surface of the cylindrical micro fly's eye lens 10 as on the pupil plane of the afocal lens 5. The overall shape of this annular illumination field similarly varies depending upon the focal length of the zoom lens 8. A rectangular microscopic refracting surface as a wavefront dividing unit element in the cylindrical micro fly's eye lens 10 is of a rectangular shape similar to a shape of an illumination field to be formed on a mask M (and, in turn, similar to a shape of an exposure region to be formed on a wafer W).

The beam incident to the cylindrical micro fly's eye lens 10 is two-dimensionally divided to form a secondary light source with a light intensity distribution approximately identical with the illumination field formed by the incident beam, i.e., a secondary light source consisting of a substantial surface illuminant of an annular shape centered on the optical axis AX, on or near the rear focal plane of the cylindrical micro fly's eye lens 10 (and on the illumination pupil virtually). Beams from the secondary light source formed on or near the rear focal plane of the cylindrical micro fly's eye lens 10 is incident to an aperture stop AS located near it.

The aperture stop AS has an aperture (light transmitting portion) of an annular shape corresponding to the secondary light source of the annular shape formed on or near the rear focal plane of the cylindrical micro fly's eye lens 10. The aperture stop AS is arranged as retractable from the illumination optical path and is arranged as replaceable with a plurality of aperture stops having respective apertures of different sizes and shapes. A method of switching the aperture stops can be selected, for example, from the well-know turret method and slide method, and others. The aperture stop AS is located at a position optically approximately conjugate with the entrance pupil plane of the projection optical system PL described later, and defines a range to contribute to illumination of the secondary light source. The installation of the aperture stop AS can be omitted.

The light from the secondary light source limited by the aperture stop AS travels through a condenser optical system 11 to illuminate a mask blind 12 in a superimposed manner. In this manner, an illumination field of a rectangular shape according to the shape and focal length of the rectangular microscopic refracting surfaces being the wavefront dividing elements of the cylindrical micro fly's eye lens 10 is formed on the mask blind 12 as an illumination field stop. The light having passed through a rectangular aperture (light transmitting portion) of the mask blind 12 is converged by an imaging optical system 13 and thereafter illuminates the mask M with a predetermined pattern therein, in a superimposed manner. Namely, the imaging optical system 13 forms an image of the rectangular aperture of the mask blind 12 on the mask M.

The pattern to be transferred is formed in the mask M held on a mask stage MS and the mask is illuminated in a pattern region of a rectangular shape (slit shape) having longer sides along the Y-direction and shorter sides along the X-direction in the entire pattern region. The light having passed through the pattern region of the mask M travels through the projection optical system PL to form an image of the mask pattern on the wafer (photosensitive substrate) W held on a wafer stage WS. Namely, the pattern image is formed in a still exposure area (effective exposure area) of a rectangular shape having longer sides along the Y-direction and shorter sides along the X-direction on the wafer W as well, so as to optically correspond to the rectangular illumination region on the mask M.

In this configuration, the mask stage MS and the wafer stage WS and, therefore, the mask M and the wafer W are synchronously moved (scanned) along the X-direction (scanning direction) in the plane (XY plane) perpendicular to the optical axis AX of the projection optical system PL in accordance with the so-called step-and-scan method, whereby a shot area (exposure area) having a width equal to the Y-directional length of the still exposure area and a length according to a scanning distance (moving distance) of the wafer W, is scanned and exposed with the mask pattern on the wafer W.

A diffractive optical element 4m for multi-pole illumination (dipole illumination, quadrupole illumination, octupole illumination, or the like) can be set instead of the diffractive optical element 4 for annular illumination in the illumination optical path, thereby to implement multi-pole illumination. When a parallel beam with a rectangular cross section is incident to the diffractive optical element for multi-pole illumination, the diffractive optical element for multi-pole illumination functions to form light intensity distributions of multi-pole shape (dipole, quadrupole, octupole, or other shape) in its far field. Therefore, beams having passed through the diffractive optical element for multi-pole illumination form illumination fields of multi-pole shape consisting of a plurality of circular illumination fields around the optical axis AX, for example, on the entrance surface of the cylindrical micro fly's eye lens 10. As a result, secondary light sources of the same multi-pole shape as the illumination fields formed on the entrance surface are also formed on or near the rear focal plane of the cylindrical micro fly's eye lens 10.

When a diffractive optical element 4c for circular illumination is set instead of the diffractive optical element 4 for annular illumination in the illumination optical path, it can implement normal circular illumination. When a parallel beam with a rectangular cross section is incident to the diffractive optical element for circular illumination, the diffractive optical element for circular illumination functions to form a light intensity distribution of a circular shape in the far field. Therefore, a beam having passed through the diffractive optical element for circular illumination forms an illumination field of a circular shape centered on the optical axis AX, for example, on the entrance surface of the cylindrical micro fly's eye lens 10. As a result, a secondary light source of the same circular shape as the illumination field formed on the entrance surface is also formed on or near the rear focal plane of the cylindrical micro fly's eye lens 10. When a diffractive optical element with an appropriate characteristic (not shown) is set instead of the diffractive optical element 4 for annular illumination in the illumination optical path, it becomes feasible to implement one of various forms of modified illuminations. A method of switching the diffractive optical element 4 can be selected, for example, from the well-known turret method and slide method, and others.

The conical axicon system 7 is composed of a first prism member 7a with a plane on the light source side and a refracting surface of a hollow conical shape on the mask side, and a second prism member 7b with a plane on the mask side and a refracting surface of a convex conical shape on the light source side, which are arranged in order from the light source side. The hollow conical refracting surface of the first prism member 7a and the convex conical refracting surface of the second prism member 7b are complementarily formed so as to fit each other. At least one of the first prism member 7a and the second prism member 7b is arranged as movable along the optical axis AX so as to be able to vary the spacing between the hollow conical refracting surface of the first prism member 7a and the convex conical refracting surface of the second prism member 7b. The action of the conical axicon system 7 and the action of the zoom lens 8 will be described below with a focus on the annular or quadrupolar secondary light sources.

In a state in which the hollow conical refracting surface of the first prism member 7a and the convex conical refracting surface of the second prism member 7b are in contact with each other, the conical axicon system 7 functions as a plane-parallel plate and causes no effect on the annular or quadrupolar secondary light sources formed. As the hollow conical refracting surface of the first prism member 7a and the convex conical refracting surface of the second prism member 7b are moved away from each other, the outside diameter (inside diameter) of the annular or quadrupolar secondary light sources varies while the width of the annular or quadrupolar secondary light sources (half of the difference between the outside diameter and the inside diameter of the annular secondary light source; or half of the difference between the diameter (outside diameter) of a circle circumscribed about the quadrupolar secondary light sources and the diameter (inside diameter) of a circle inscribed in the quadrupolar secondary light sources) is kept constant. Namely, the separation results in change in the annular ratio (inside diameter/outside diameter) and the size (outside diameter) of the annular or quadrupolar secondary light sources.

The zoom lens 8 has a function to similarly enlarge or reduce the overall shape of the annular or quadrupolar secondary light sources. For example, when the focal length of the zoom lens 8 is increased from a minimum to a predetermined value, the overall shape of the annular or quadrupolar secondary light sources is similarly enlarged. In other words, the action of the zoom lens 8 varies both the width and the size (outside diameter), without change in the annular ratio of the annular or quadrupolar secondary light sources. In this manner, the annular ratio and size (outside diameter) of the annular or quadrupolar secondary light sources can be controlled by the actions of the conical axicon system 7 and the zoom lens 8.

Figure 9:
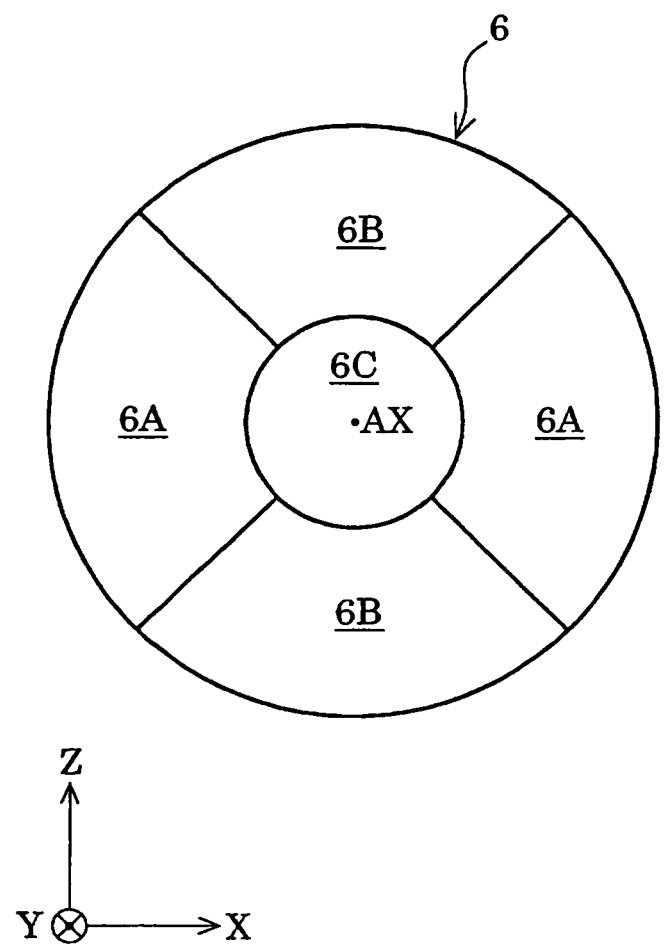
FIG. 9 is a drawing schematically showing a configuration of a polarization converting element shown in FIG. 7.

The polarization converting element 6 is arranged at or near the pupil position of the afocal lens 5, i.e., on or near the pupil plane of the illumination optical system (2-13). In the case of the annular illumination, therefore, a beam with an approximately annular cross section centered on the optical axis AX is incident to the polarization converting element 6. The polarization converting element 6, as shown in FIG. 9, has an effective region of an annular shape centered on the optical axis AX as a whole and this annular effective region is composed of four basic elements of a fan shape around the optical axis AX obtained by equally dividing the effective region in the circumferential direction. Among these four basic elements, a pair of basic elements opposed on both sides of the optical axis AX have the same characteristics.

Namely, the four basic elements consist of two types of basic elements 6A and 6B two each with mutually different thicknesses (lengths in the optical-axis direction) along the transmitting direction (Y-direction) of light. Specifically, the thickness of the first basic elements 6A is set larger than the thickness of the second basic elements 6B. As a result, one surface (e.g., the entrance surface) of the polarization converting element 6 is planar, while the other surface (e.g., the exit surface) is uneven because of the difference between the thicknesses of the basic elements 6A, 6B. Each of the basic elements 6A, 6B is made of rock crystal being an optical material with optical activity (rotatory polarization characteristic) and its crystal optical axis is set to be aligned approximately with the optical axis AX.

Figure 10:
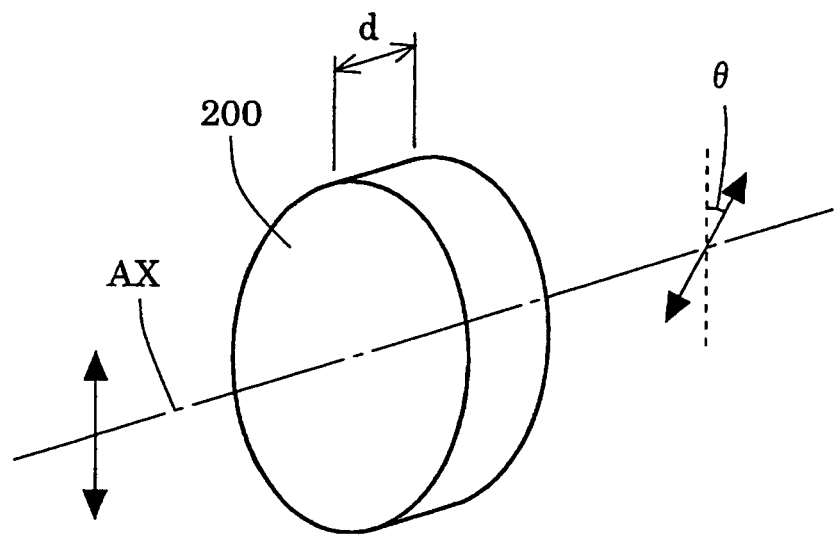
FIG. 10 is a drawing to illustrate the optical activity of rock crystal.

The optical activity of rock crystal will be briefly described below with reference to FIG. 10. Referring to FIG. 10, an optical member 200 of plane-parallel plate shape made of rock crystal in the thickness d is arranged so that its crystal optical axis is aligned with the optical axis AX. In this case, linearly polarized light incident to the optical member 200 is emitted in a state in which its polarization direction is rotated by θ about the optical axis AX by virtue of the optical activity thereof. At this time, the angle of rotation (optical rotatory angle) θ of the polarization direction due to the optical activity of the optical member 200 is represented by Eq (a) below, using the thickness d of the optical member 200 and the optical activity p of rock crystal.

$$\theta = d \cdot \rho \tag{a}$$

In general, the optical activity ρ of rock crystal has wavelength dependence (a property of varying values of optical activity dependent on wavelengths of used light: optical rotating dispersion) and, specifically, it tends to increase with decrease in the wavelength of used light. According to the description on p 167 in "Applied Optics II," the optical activity p of rock crystal for light with the wavelength of 250.3 nm is 153.9°/mm.

The first basic elements 6A have the thickness dA defined as follows: when linearly polarized light with the polarization direction along the Z-direction is incident thereto, they emit linearly polarized light with the polarization direction along a direction resulting from +180° rotation of the Z-direction around the Y-axis, i.e. along the Z-direction. In this case, therefore, the Z-direction is the polarization direction of beams passing through a pair of arcuate regions 31A formed by beams optically rotated by the pair of first basic elements 6A, in the annular secondary light source 31 shown in FIG. 11.

The second basic elements 6B have the thickness dB defined as follows: when linearly polarized light with the polarization direction along the Z-direction is incident thereto, they emit linearly polarized light with the polarization direction along a direction resulting from +90° rotation of the Z-direction around the Y-axis, i.e., along the X-direction. In this case, therefore, the X-direction is the polarization direction of beams passing through a pair of arcuate regions 31B formed by beams optically rotated by the pair of second basic elements 6B, in the annular secondary light source 31 shown in FIG. 11.

The polarization converting element 6 can also be obtained by combining the four basic elements separately made, or the polarization converting element 6 can also be obtained by forming the required uneven shape (level differences) in a rock crystal substrate of plane-parallel plate shape. In general, various modification examples can be contemplated as to the number, shape, optical properties, etc. of the basic elements constituting the polarization converting element 6. In order to enable implementation of normal circular illumination without retracting the polarization converting element 6 from the optical path, the polarization converting element 6 is provided with a circular central region 6C having the size not less than one third of the radial size of the effective region of the polarization converting element 6 and having no optical activity. The central region 6C herein may be made, for example, of an optical material without optical activity like silica, or may be simply a circular aperture.

Figure 11:
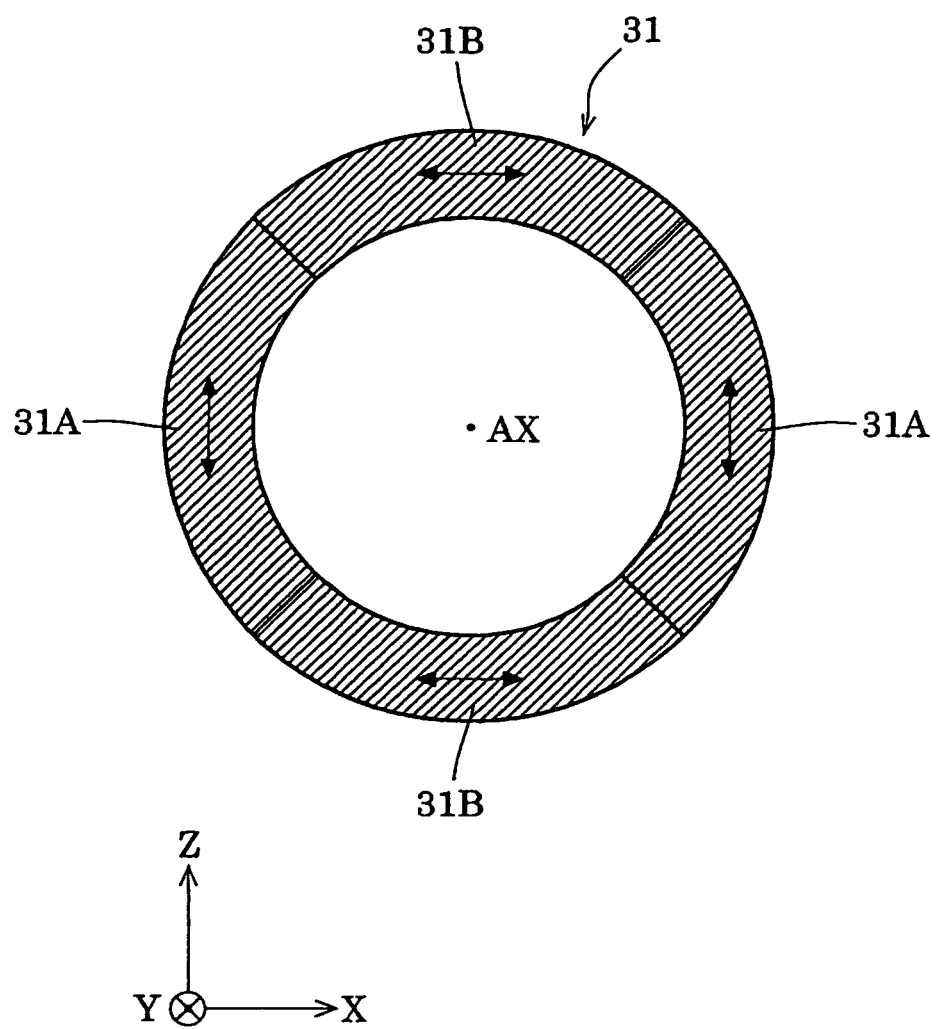
FIG. 11 is a drawing schematically showing a secondary light source of an annular shape set in a circumferentially polarized state by action of the polarization converting element.

In the present embodiment, circumferential polarization (azimuthal polarization) annular illumination (modified illumination in which beams passing through the annular secondary light source are set in a circumferentially polarized state) is implemented in such a manner that the angular position of the crystal optical axis of the half wave plate 3b in the polarization state switch 3 is adjusted about the optical axis to make light of Z-directional polarization (linearly polarized light with the polarization direction along the Z-direction) incident to the diffractive optical element 4 for annular illumination whereby the Z-directionally polarized light is made incident to the polarization converting element 6. As a result, the annular secondary light source (annular illumination pupil distribution) 31 is formed on or near the rear focal plane of the cylindrical micro fly's eye lens 10, as shown in FIG. 11, and beams passing through the annular secondary light source 31 are set in the circumferentially polarized state.

In the circumferentially polarized state, beams passing through the respective arcuate regions 31A, 31B constituting the annular secondary light source 31 are changed into a linearly polarized state with the polarization direction aligned approximately with a tangent direction to a circle centered on the optical axis AX, at the center position along the circumferential direction of each arcuate region 31A, 31B. In the circumferential polarization (azimuthal polarization) annular illumination based on the annular illumination pupil distribution in the circumferentially polarized state, the light impinging upon the wafer W as a final illumination target surface is in a polarized state in which the principal component is S-polarized light. Here the S-polarized light is linearly polarized light with the polarization direction along a direction normal to the plane of incidence (or polarized light whose electric vector is vibrating in directions normal to the plane of incidence). The plane of incidence is defined as a plane including a normal to a boundary surface of a medium (illumination target surface: a surface of wafer W) at a point where the light reaches the boundary surface, and a direction of incidence of the light.

As a result, the circumferential polarization (azimuthal polarization) annular illumination achieves an improvement in the optical performance (the depth of focus and others) of the projection optical system and provides a good mask pattern image with high contrast on the wafer (photosensitive substrate). In general, not only in the case of the annular illumination, but also, for example, in the case of illumination based on a multi-pole illumination pupil distribution in the circumferentially polarized state, the light incident to the wafer W is in the polarized state in which the principal component is the S-polarized light, and a good mask pattern image with high contrast is obtained on the wafer W. In this case, a diffractive optical element for multi-pole illumination (dipole illumination, quadrupole illumination, octupole illumination, or the like) is set instead of the diffractive optical element 4 for annular illumination in the illumination optical path and the angular position of the crystal optical axis of the half wave plate 3b in the polarization state switch 3 is adjusted around the optical axis to make Z-directionally polarized light incident to the diffractive optical element for multi-pole illumination, whereby the Z-directionally polarized light is made incident to the polarization converting element 6.

Figure 12:
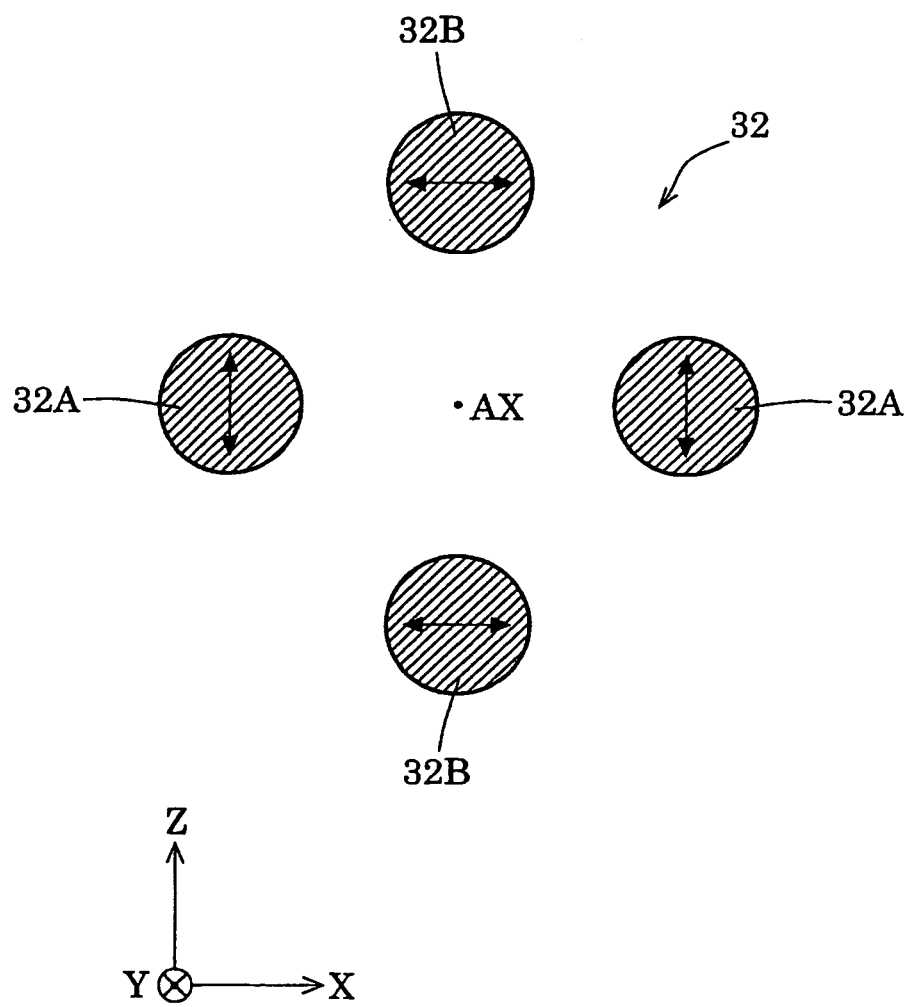
FIG. 12 is a drawing schematically showing secondary light sources of quadrupolar shape set in a circumferentially polarized state by action of the polarization converting element.

Specifically, for example, in the case of circumferentially polarized quadrupole illumination (modified illumination in which beams passing through quadrupolar secondary light sources are set in the circumferentially polarized state), the angular position of the crystal optical axis of the half wave plate 3b in the polarization state switch 3 is adjusted around the optical axis to make the Z-directionally polarized light incident to the diffractive optical element for quadrupole illumination whereby the Z-directionally polarized light is made incident to the polarization converting element 6. As a result, the quadrupolar secondary light sources (quadrupole illumination pupil distributions) 32 are formed, as shown in FIG. 12, on or near the rear focal plane of the cylindrical micro fly's eye lens 10 and beams passing through the quadrupolar secondary light sources 32 are set in the circumferentially polarized state. In the circumferentially polarized quadrupole illumination, beams passing through respective circular regions 32A, 32B constituting the quadrupolar secondary light sources 32 are changed into a linearly polarized state with the polarization direction aligned approximately with a tangent direction to a circle centered on the optical axis AX, at a center position along the circumferential direction of each circular region 32A, 32B.

In the exposure apparatus of the present embodiment, the movable optical members arranged as movable in the optical path like the movable prism member in the conical axicon system 7 and the movable lens in the zoom lens 8 are located upstream of the optical integrator system OP. As these movable optical members move, the angles and angular range of light incident to the optical integrator system OP vary. In the present embodiment, however, even when the angles and angular range of light incident to the auxiliary fly's eye element 9 vary, for example, due to the movement of the movable optical members located upstream of the optical integrator system OP, the angles and angular range of light incident to each wavefront dividing element of the cylindrical micro fly's eye lens 10 can be kept constant by the action of the auxiliary fly's eye element 9 and, in turn, the uniform illuminance distribution can be maintained on the wafer W being the final illumination target surface.

For fully exercising the action of the auxiliary fly's eye element 9 in the present embodiment to achieve the effect of the present embodiment well, as described previously, the spacing L12 between the exit surface of the auxiliary fly's eye element 9 and the entrance surface of the cylindrical micro fly's eye lens 10 can satisfy Condition (1) in the X-direction and in the Z-direction. However, the exposure apparatus of the step-and-scan method as in the present embodiment has the averaging effect of scanning exposure by which no significant issue occurs even when there remains some illuminance unevenness in the scanning direction (scan direction: X-direction) in a still exposure region of rectangular shape elongated along the Y-direction on the wafer W. In other words, the illuminance unevenness to be suppressed in the still exposure region on the wafer W is illuminance unevenness in the direction perpendicular to the scanning direction, i.e., the perpendicular direction to scanning (non-scan direction: Y-direction).

In the present embodiment, therefore, the spacing L12 between the exit surface of the auxiliary fly's eye element 9 and the entrance surface of the cylindrical micro fly's eye lens 10 can satisfy Condition (1) in the Z-direction corresponding to the perpendicular direction to scanning. In order to avoid a loss in light quantity in the optical integrator system OP, the spacing L12 between the exit surface of the auxiliary fly's eye element 9 and the entrance surface of the cylindrical micro fly's eye lens 10 can satisfy Condition (2) in the X-direction and in the Z-direction.

In the above-described embodiment, the cylindrical micro fly's eye lens 10 as the main fly's eye element is composed of the first fly's eye member 10a and the second fly's eye member 10b and each of the first fly's eye member 10a and the second fly's eye member 10b has a plurality of entrance refracting surfaces of the cylindrical shape arranged in juxtaposition in the X-direction and a plurality of exit refracting surfaces of the cylindrical shape arranged in juxtaposition in the Z-direction. However, without having to be limited to this, the main fly's eye element can also be composed of a single optical member having a plurality of entrance refracting surfaces of a curved shape two-dimensionally juxtaposed and a plurality of exit refracting surfaces of a curved shape two-dimensionally juxtaposed, for example, like the fly's eye lens 120 shown in FIG. 5.

The foregoing embodiment is an application of the present embodiment to the exposure apparatus for implementing scan exposure of a pattern in each exposure area of a wafer in accordance with the so-called step-and-scan method, while moving the mask and the wafer relative to the projection optical system. However, without having to be limited to this, the present embodiment can also be applied to exposure apparatus for sequentially implementing exposure of a pattern in a shot area of a wafer in accordance with the so-called step-and-repeat method by performing one-shot exposure while two-dimensionally driving and controlling the wafer.

The exposure apparatus according to the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling blocks from the various sub-systems into the exposure apparatus include mechanical connections, wire connections of electric circuits, pipe connections of pneumatic circuits, etc. between the various sub-systems. It is needless to mention that there are assembling blocks of the individual sub-systems, before the assembling blocks from the various sub-systems into the exposure apparatus. After completion of the assembling blocks from the various sub-systems into the exposure apparatus, overall adjustment is carried out to ensure various accuracies as the entire exposure apparatus. The manufacture of exposure apparatus can be performed in a clean room in which the temperature, cleanliness, etc. are controlled.

The exposure apparatus according to the above-described embodiment can manufacture microdevices (semiconductor devices, imaging devices, liquid-crystal display devices, thin-film magnetic heads, etc.) through a process of illuminating a mask (reticle) by the illumination optical apparatus (illumination block) and exposing a photosensitive substrate with a transfer pattern formed in a mask, by the projection optical system (exposure block). An example of a method for obtaining semiconductor devices as microdevices by forming a predetermined circuit pattern in a wafer or the like as a photosensitive substrate by means of the exposure apparatus of the above embodiment will be described below with reference to the flowchart of FIG. 13.

Figure 13:
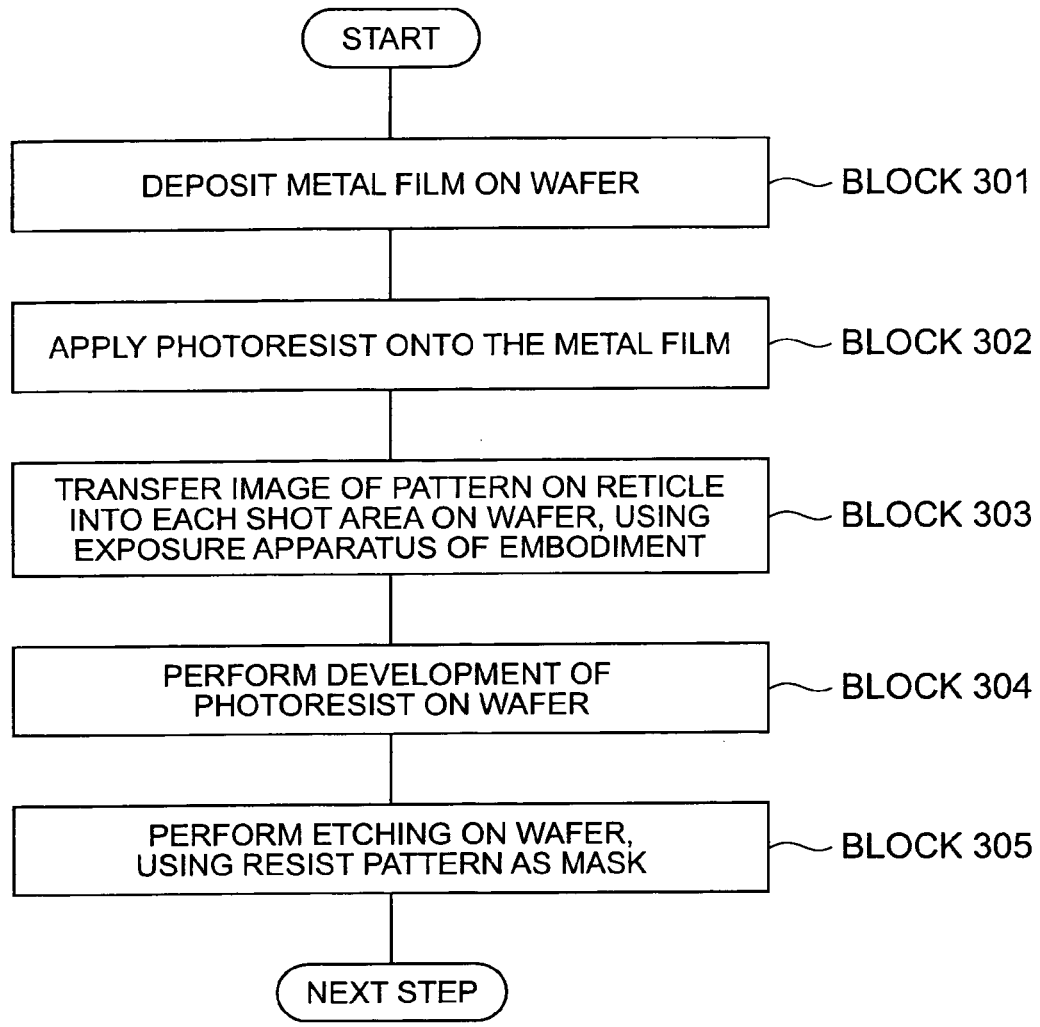
FIG. 13 is a flowchart of a method for obtaining semiconductor devices as microdevices.

The first block 301 in FIG. 13 is to deposit a metal film on each wafer in one lot. The next block 302 is to apply a photoresist onto the metal film on each wafer in the lot. The subsequent block 303 is to use the exposure apparatus of the above embodiment to sequentially transfer an image of a pattern on a mask into each shot area on each wafer in the lot through the projection optical system of the exposure apparatus. The subsequent block 304 is to perform development of the photoresist on each wafer in the lot and the next block 305 is to perform etching using the resist pattern on each wafer in the lot as a mask, and thereby to form a circuit pattern corresponding to the pattern on the mask, in each shot area on each wafer. Thereafter, devices such as semiconductor devices are manufactured through blocks including formation of circuit patterns in upper layers. The above-described semiconductor device manufacturing method permits us to obtain the semiconductor devices with extremely fine circuit patterns at high throughput.

Figure 14:
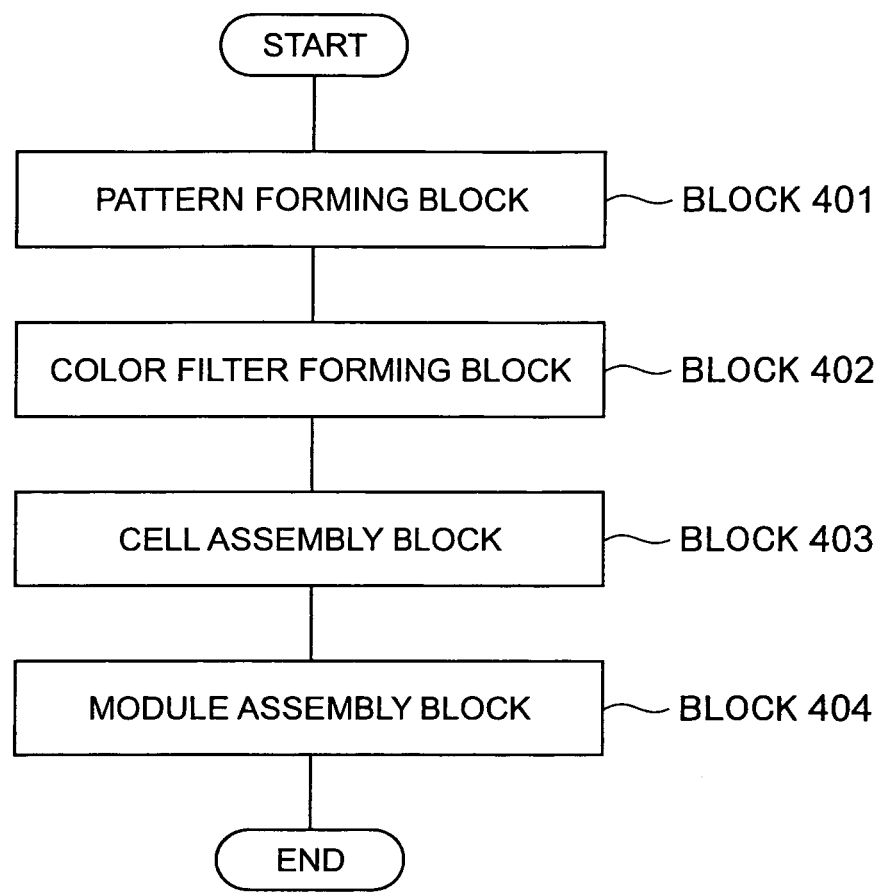
FIG. 14 is a flowchart of a method for obtaining a liquid-crystal display device as a microdevice.

The exposure apparatus of the above embodiment can also manufacture a liquid-crystal display device as a microdevice by forming predetermined patterns (circuit pattern, electrode pattern, etc.) on plates (glass substrates). An example of a method in this case will be described below with reference to the flowchart of FIG. 14. In FIG. 14, a pattern forming block 401 is to execute the so-called photolithography block of transferring a pattern of a mask onto a photosensitive substrate (a glass substrate coated with a resist or the like) by means of the exposure apparatus of the above embodiment. This photolithography block results in forming a predetermined pattern including a large number of electrodes and others on the photosensitive substrate. Thereafter, the exposed substrate is processed through each of blocks including a development block, an etching block, a resist removing block, etc. whereby the predetermined pattern is formed on the substrate, followed by the next color filter forming block 402.

The next color filter forming block 402 is to form a color filter in which a large number of sets of three dots corresponding to R (Red), G (Green), and B (Blue) are arrayed in a matrix pattern or in which sets of filters of three stripes of R, G, and B are arrayed in the horizontal scan line direction. After the color filter forming block 402, a cell assembling block 403 is executed. The cell assembling block 403 is to assemble a liquid crystal panel (liquid crystal cell) using the substrate with the predetermined pattern obtained in the pattern forming block 401, the color filter obtained in the color filter forming block 402, and others.

In the cell assembling block 403, the liquid crystal panel (liquid crystal cell) is manufactured, for example, by pouring a liquid crystal into between the substrate with the predetermined pattern obtained in the pattern forming block 401 and the color filter obtained in the color filter forming block 402. The subsequent module assembling block 404 is to attach various components such as electric circuits and a backlight for display operation of the assembled liquid crystal panel (liquid crystal cell) to complete the liquid-crystal display device. The above-described manufacturing method of the liquid-crystal display device permits us to obtain the liquid-crystal display device with extremely fine circuit patterns at high throughput.

The aforementioned embodiment used the ArF excimer laser light (the wavelength: 193 nm) or the KrF excimer laser light (the wavelength: 248 nm) as the exposure light, but the exposure light does not have to be limited to these: an embodiment of the present invention can also be applied to any other appropriate laser light source, e.g., an $F_2$ laser light source for supplying the laser light at the wavelength of 157 nm.

The aforementioned embodiment was the application of an embodiment of the present invention to the optical integrator system used in the illumination optical apparatus of the exposure apparatus, but, without having to be limited to this, an embodiment of the present invention can also be applied to any optical integrator system used in commonly-used optical apparatus. The foregoing embodiment was the application of an embodiment of the present invention to the illumination optical apparatus for illuminating the mask or the wafer in the exposure apparatus, but, without having to be limited to this, an embodiment of the present invention can also be applied to commonly-used illumination optical apparatus for illuminating a surface to be illuminated except for the mask or the wafer.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An optical integrator system comprising a first optical integrator including a plurality of first wavefront dividing elements juxtaposed, and a second optical integrator including a plurality of second wavefront dividing elements juxtaposed, said first optical integrator and said second optical integrator being arranged in order from an entrance side of light;

wherein each of the first wavefront dividing elements is so constructed that rays obliquely incident to a center on an optical axis of an entrance surface of the first wavefront dividing element are emitted in parallel with the optical axis from the first wavefront dividing element;

each of the second wavefront dividing elements is so constructed that rays obliquely incident to a center on an optical axis of an entrance surface of the second wavefront dividing element are emitted in parallel with the optical axis from the second wavefront dividing element;

a spacing L12 between an exit surface of the first optical integrator and an entrance surface of the second optical integrator satisfies the condition of $P2/(2 \times \tan \theta) < L12$, where P2 is a pitch along a predetermined direction of the second wavefront dividing elements, and $\theta$ a maximum exit angle (half angle) along the predetermined direction of light from the first wavefront dividing elements; and no lens or optical element having optical power is arranged in the optical path between the first optical integrator and the second optical integrator.

2. The optical integrator system according to claim 1, wherein the spacing L12 satisfies the condition of $L12 < D2/(2 \times \tan \theta)$, where D2 is a length along the predetermined direction of the entrance surface of the second optical integrator.

3. The optical integrator system according to claim 2, wherein the pitch P2 along the predetermined direction of the second wavefront dividing elements is substantially different from an integral multiple of a pitch P1 along the predetermined direction of the first wavefront dividing elements.

4. The optical integrator system according to claim 3, wherein each of the first wavefront dividing elements is so constructed that a first maximum exit angle (half angle) of light from the first wavefront dividing element made by light incident along a direction of the optical axis to the entrance surface of the first wavefront dividing element is equal to a second maximum exit angle (half angle) of light from the first wavefront dividing element made by light incident along an oblique direction to the optical axis to the entrance surface of the first wavefront dividing element, and each of the second wavefront dividing elements is so constructed that a third maximum exit angle (half angle) of light from the second wavefront dividing element made by light incident along a direction of the optical axis to the entrance surface of the second wavefront dividing element is equal to a fourth maximum exit angle (half angle) of light from the second wavefront dividing element made by light incident along an oblique direction to the optical axis to the entrance surface of the second wavefront dividing element.

5. The optical integrator system according to claim 4, wherein the second optical integrator comprises a single optical member, and
wherein the single optical member includes a plurality of entrance refracting surfaces of a curved shape two-dimensionally juxtaposed, and a plurality of exit refracting surfaces of a curved shape two-dimensionally juxtaposed.

6. The optical integrator system according to claim 4, wherein the second optical integrator comprises a first optical member and a second optical member arranged in order from the entrance side of light, and
each of the first optical member and the second optical member includes a plurality of entrance refracting surfaces of a cylindrical shape arranged in juxtaposition in one direction, and a plurality of exit refracting surfaces of a cylindrical shape arranged in juxtaposition in another direction.

7. An illumination optical apparatus for illuminating a surface to be illuminated by light from a light source, the illumination optical apparatus comprising the optical integrator system as set forth in claim 1, said optical integrator system being arranged in an optical path between the light source and the surface to be illuminated.

8. The illumination optical apparatus according to claim 7, comprising a movable optical member movably arranged in an optical path between the light source and the optical integrator system.

9. An exposure apparatus comprising the illumination optical apparatus as set forth in claim 8, for illuminating a predetermined pattern, whereby a photosensitive substrate is exposed with the predetermined pattern.

10. The exposure apparatus according to claim 9, comprising a projection optical system for forming an image of the predetermined pattern on the photosensitive substrate, wherein the predetermined pattern and the photosensitive substrate are moved along a scanning direction relative to the projection optical system whereby the predetermined pattern is projected onto the photosensitive substrate to effect projection exposure of the photosensitive substrate with the predetermined pattern.

11. The exposure apparatus according to claim 10, wherein the predetermined direction in the optical integrator system corresponds to a direction perpendicular to the scanning direction on the photosensitive substrate.

12. A device manufacturing method comprising:
exposing the photosensitive substrate with the predetermined pattern, using the exposure apparatus as set forth in claim 9; and
developing the exposed photosensitive substrate.

13. An optical integrator system comprising an optical member including a plurality of optical elements juxtaposed and forming a uniform exit angle, and an optical integrator including a plurality of wavefront dividing elements juxtaposed, said optical member and said optical integrator being arranged in order from an entrance side of light;
wherein each of the optical elements is so constructed that rays obliquely incident to a center on an optical axis of an entrance surface of the optical element are emitted in parallel with the optical axis from the optical element;
each of the wavefront dividing elements is so constructed that rays obliquely incident to a center on an optical axis of an entrance surface of the wavefront dividing element are emitted in parallel with the optical axis from the wavefront dividing element;
one optical element of the optical member illuminates a region larger than an entrance surface of one wavefront dividing element of the optical integrator and illuminates a region smaller than an entrance surface of the optical integrator, and
no lens or optical element having optical power is arranged in the optical path between said optical member and said optical integrator.

14. The optical integrator system according to claim 13, wherein each of the optical elements is so constructed that a first maximum exit angle (half angle) of light from the optical element made by light incident along a direction of the optical axis to the entrance surface of the optical element is equal to a second maximum exit angle (half angle) of light from the optical element made by light incident along an oblique direction to the optical axis to the entrance surface of the optical element; and
each of the wavefront dividing elements is so constructed that a third maximum exit angle (half angle) of light from the wavefront dividing element made by light incident along the direction of the optical axis to the entrance surface of the wavefront dividing element is equal to a fourth maximum exit angle (half angle) of light from the wavefront dividing element made by light incident along an oblique direction to the optical axis to the entrance surface of the wavefront dividing element.

15. An illumination optical apparatus for illuminating a surface to be illuminated by light from a light source, the illumination optical apparatus comprising the optical integrator system as set forth in claim 13, said optical integrator system being arranged in an optical path between the light source and the surface to be illuminated.

16. The illumination optical apparatus according to claim 15, comprising a movable optical member movably arranged in an optical path between the light source and the optical integrator system.

17. An exposure apparatus comprising the illumination optical apparatus as set forth in claim 16, for illuminating a predetermined pattern, whereby a photosensitive substrate is exposed with the predetermined pattern.

18. The exposure apparatus according to claim 17, comprising a projection optical system for forming an image of the predetermined pattern on the photosensitive substrate, wherein the predetermined pattern and the photosensitive substrate are moved along a scanning direction relative to the projection optical system whereby the predetermined pattern is projected onto the photosensitive substrate to effect projection exposure of the photosensitive substrate with the predetermined pattern.

19. The exposure apparatus according to claim 18, wherein the predetermined direction in the optical integrator system corresponds to a direction perpendicular to the scanning direction on the photosensitive substrate.

20. A device manufacturing method comprising:
exposing the photosensitive substrate with the predetermined pattern, using the exposure apparatus as set forth in claim 17; and
developing the exposed photosensitive substrate.

* * * * *

UNITED STATES PATENT AND TRADEMARK OFFICE
CERTIFICATE OF CORRECTION

PATENT NO. : 8,587,764 B2  
APPLICATION NO. : 12/068818  
DATED : November 19, 2013  
INVENTOR(S) : Kita Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1359 days.

Signed and Sealed this  
Nineteenth Day of May, 2015

Michelle K. Lee  
*Director of the United States Patent and Trademark Office*